(12) United States Patent
Doyama et al.

(10) Patent No.: US 6,607,676 B2
(45) Date of Patent: Aug. 19, 2003

(54) PREPARATION OF CARBONACEOUS SEMICONDUCTOR MATERIAL

(75) Inventors: Masao Doyama, Tokyo (JP); Shigehiko Yamada, Kanagawa (JP)

(73) Assignee: Ube Industries, Ltd., Yamaguchi (JP)

(*) Notice: Subject to any disclaimer, the term of this patent is extended or adjusted under 35 U.S.C. 154(b) by 0 days.

(21) Appl. No.: 10/141,804

(22) Filed: May 8, 2002

(65) Prior Publication Data

US 2002/0130297 A1 Sep. 19, 2002

Related U.S. Application Data

(63) Continuation of application No. 09/457,191, filed on Dec. 8, 1999, now abandoned.

(30) Foreign Application Priority Data

Mar. 19, 1999 (JP) .............................. 11-075629

(51) Int. Cl.⁷ ................................................ H01B 1/12
(52) U.S. Cl. .................. 252/62.3 E; 252/503; 252/506; 252/509; 252/508; 423/445 R; 423/414
(58) Field of Search ....................... 252/62.3 E, 62.3 R, 252/62.3 Q, 503, 506, 508, 509; 423/447.2, 414, 445 R, 447.5

(56) References Cited

U.S. PATENT DOCUMENTS

| | | | | |
|---|---|---|---|---|
| 3,362,917 A | * | 1/1968 | Bruck | ........................ 252/500 |
| 4,236,307 A | * | 12/1980 | Colla et al. | .................... 29/857 |
| 4,401,590 A | * | 8/1983 | Yoshimura et al. | ......... 252/514 |
| 4,599,193 A | * | 7/1986 | Murase et al. | .............. 252/511 |

FOREIGN PATENT DOCUMENTS

| | | | |
|---|---|---|---|
| EP | 663687 | * | 7/1995 |
| JP | 2976024 B1 | * | 11/1999 |

* cited by examiner

Primary Examiner—C. Melissa Koslow
(74) Attorney, Agent, or Firm—Reed Smith LLP

(57) ABSTRACT

Carbonaceous semiconductor material is prepared by heating an organic polymer to carbonize the polymer and incorporating into the carbonized polymer one or more hetero atoms such as those of Group II, III, IV, V and VI of the Periodic Table. Carbonaceous semiconductor material is also prepared by heating an organic polymer containing one or more of the hetero atoms until the hetero atom-containing polymer is carbonized.

12 Claims, No Drawings

PREPARATION OF CARBONACEOUS SEMICONDUCTOR MATERIAL

CROSS-REFERENCES TO RELATED APPLICATIONS

This is a continuation of application Ser. No. 09/457,191, filed Dec. 8, 1999, now abandoned which claims priority of Japanese Application No. 11-075629 filed Mar. 19, 1999, the complete disclosure of which are hereby incorporated by reference.

FIELD OF THE INVENTION

The present invention relates a process for preparing carbonaceous semiconductor material.

BACKGROUND OF THE INVENTION

Until now, no practically employable carbonaceous semiconductor materials have been known.

Carbonaceous material inherently shows functions of semiconductor. However, it has been considered that carbonaceous material can hardly be converted into semiconductors of various types such as p-type and n-type, for the following reasons.

1) Generally available carbonaceous material is produced by the steps of mixing carbonaceous particles having various sizes such as petroleum cokes with carbonizable binder such as petroleum pitch, molding the mixture in a desired form, and carbonizing the molded mixture. Accordingly, the carbonized product has a wide particle size distribution and further has a poorly homogeneous composition. Therefore, it hardly gives a homogenous hetero atom-doped composition such as a homogeneous hetero atom-doped silicon product. Moreover, the generally available carbonaceous material per se contains not a small amount of impurities and the impurities are not easily removed to a satisfactory level. The impurities remaining in the carbonaceous material disturb the doped material to show the desired semiconductor functions.

2) Carbonaceous material produced by Chemical Vapor Deposition (CVD) of a carbon atom-containing gas such as methane, propane or benzene onto a heated substrate contains little amount of impurities. However, the carbonaceous film produced on the substrate generally does not have a uniform grain size distribution. Therefore, it cannot give a hetero atom-doped composition having a uniform composition.

3) Generally available glassy carbon has a uniform composition, but is so extremely fragile that a practically employable semi-conductor material can hardly be produced. Further, there also are problems of remaining impurities in the glassy carbon, which disturb the function of semiconductor of the resulting material. Moreover, known reinforcing technologies such as conversion to C/C composite using a high performance carbon fiber bring about non-uniform products, such as those produced in the cases 1) and 2) described above.

It is an object of the invention to provide a process for preparing a practically employable carbonaceous material which favorably functions as semiconductor.

SUMMARY OF THE INVENTION

The present invention resides in a process (Process-I) for preparing carbonaceous semiconductor material which comprises the steps of:

heating an organic polymer to carbonize the polymer; and
incorporating into the carbonized polymer one or more hetero atoms other than carbon atom which are selected from the group consisting of atoms belonging to Group II, III, IV, V and VI of the Periodic Table.

The invention further resides in a process (Process-II) for preparing carbonaceous semiconductor material which comprises heating an organic polymer which contains one or more hetero atoms other than carbon atom which are selected from the group consisting of atoms belonging to Group II, III, IV, V and VI of the Periodic Table, to carbonize the hetero-atom containing polymer.

DETAILED DESCRIPTION OF THE INVENTION

Preferred embodiments of the invention are described below.

1) Process-I wherein the carbonized polymer is purified before it is subjected to the incorporation of one or more hetero atoms.
2) Process-I wherein the step of heating an organic polymer is performed under the condition that the heated polymer is kept under pressure to orient carbon molecules in the carbonized polymer.
3) Process-I wherein the hetero atom is selected from the group consisting of B, Al, Ga, In, N, P, As, Sb, and Bi.
4) Process-I wherein the organic polymer to be heated is in the form of a sheet.
5) Process-I wherein the organic polymer is an aromatic polyimide polymer.
6) Process-II wherein the hetero atom is selected from the group consisting of B, Al, Ga, In, N, P, As, Sb, and Bi.
7) Process-II wherein the organic polymer to be heated is in the form of a sheet.
8) Process-II wherein the organic polymer is an aromatic polyimide polymer.

The invention is described below in more detail.

The organic polymer to be carbonized can be an aromatic polyimide resin, an aromatic polyamideimide resin, an aromatic polyamide resin, an aromatic polyoxadiazole, a poly-p-phenylene resin, a polybenzoimidazole resin, or a polybenzoimidazophenatholorine resin. These resins preferably are in the form of sheet (or film). Preferred is an aromatic polyimide resin which is highly resistant to heat treatment, because it gives a carbonized material having enough strength.

The heat resistant aromatic polyimide resin can be prepared by reacting an aromatic tetracarboxylic dianhydride with an aromatic diamine in an organic solvent such as N-methyl-2-pyrrolidone or N,N-dimethylacetamide, casting the resulting polymer solution on a support, drying the casted polymer solution film, separating the dried film from the support, and heating the separated film to an elevated temperature (for instance, to a maximum temperature in the range of approximately 450–500° C.) for imidization and removal of the solvent.

In the above-mentioned process, a hetero atom other than carbon atom which belongs to Group II, III, IV, V or VI of the Periodic Table can be incorporated into the polymer solution.

The hetero atom incorporated into the carbonaceous material is required for providing functions of semiconductor to the resulting carbonaceous material of the invention. The hetero atom is so selected as to give a carbonaceous semiconductor material having the desired semiconductor function.

For instance, a p-type semiconductor (or a p-type diffusion area of semiconductor) can be produced by doping the carbonaceous material with B, Al, Ga, or In which belongs to Group III of the Periodic Table, while an n-type semiconductor (or an n-type diffusion area of semiconductor) can be produced by doping the carbonaceous material with N, P, As, Sb, or Bi. P, As and Sb belonging to Group V of the Periodic Table are preferred as dopants for producing an n-type semiconductor (or an n-type diffusion area of semiconductor). The amount of dopant can be determined depending on the purpose and function expected by the doping.

The dopant hetero atom can be incorporated into the polymer to be carbonized or its carbonized product in the form of the following compounds: organic phosphorus compounds, organic boron compounds, organic arsenical compounds, organic antimony compounds, organic aluminum compounds, organic gallium compounds, and organic indium compounds.

In the process of the invention, the carbonization of the organic polymer can be performed by heating the organic polymer at a high temperature such 700–1,500° C., preferably 800–1,000° C., for 0.5–2 hours in vacuo or in a non-oxidative gaseous atmosphere, so that a homogeneous carbonaceous material having no fragility of glassy carbon can be produced. Particularly, if the heat treatment is performed at a 700–900° C., the resulting carbonaceous semiconductor material has an energy band gap ($\Delta Et$) of approximately 0.2 eV or more.

The carbonaceous film produced by carbonizing an organic polymer film is preferably heated in a high-purity graphite furnace so that the carbonaceous film can have high purity. Thus purified carbonaceous film is then doped with a hetero atom to become a carbonaceous semiconductor material having the desired semiconductor functions.

The doping procedure can be performed, for instance, by ion implantation or ion diffusion. Preferred is that the non-glassy carbonaceous material produced by the high temperature-heat treatment is doped with a hetero atom by ion implantation. Thus doped carbonaceous material shows favorable semiconductor functions.

The carbonaceous semiconductor material of the invention is new and shows heat resistance higher than that of the known silicon semiconductor. The carbonaceous semiconductor material of the invention is not required to be subjected to polishing treatment, if the starting organic polymer article has a smooth surface.

The invention is further described by the following examples. In the examples, physical properties of the organic polymer film to be carbonized were determined by the following methods.

Elastic modulus in tension:
determined according to ASTM D882-83 (MD).
Heat shrinkage ratio:
determined according to JIS C2318 (at 400° C.).
Coefficient of linear expansion (23–300° C.):
determined in TMA apparatus using a stress relaxed sample (heat treated at 350° C. for 30 min., drawing mode, 2 g weight, sample length 10 mm, 20° C./min.).

EXAMPLE 1

A longitudinal aromatic polyimide film of 50 µm thick was prepared from 3,3',4,4'-biphenyltetracarboxylic dianhydride and p-phenylenediamine. The prepared polyimide film had the following physical properties:

Elastic modulus in tension (MD): 900 kg/mm$^2$
Heat shrinkage ratio (400° C., 2 hrs.): lower than 0.5%
Coefficient of linear expansion (23–300° C.):
$1.3 \times 10^{-5}$ cm/cm/° C.

The polyimide film was cut into a piece of 20 mm (width)×40 mm (length). The obtained piece was placed between a pair of graphite plates [30 mm (width)×50 mm (length)×5 mm (thickness)] and then heated to approx. 900° C. by increasing the temperature at an average rate of 4° C./min. in a nitrogen or hydrogen stream, in a furnace which was free from environmental contamination.

The carbonaceous film prepared by the above-mentioned treat treatment was not similar to the known glassy carbonaceous material and showed no damage even when it was bent in such manner as to bring one end the film into contact with another end.

EXAMPLE 2

The carbonaceous film prepared in Example 1 was heat treated in a high purity graphite furnace using a halogen gas, so that the carbonaceous film could be purified. The purified carbonaceous film was doped with B, Al or Ga by ion implantation or ion diffusion, to give a carbonaceous semiconductor film of p-type.

The carbonaceous film was extended by applying force at both ends, to give a highly orientated carbonaceous film, which showed improved mechanical properties. Otherwise, the polyimide film is extended before or in the course of the heat treatment.

EXAMPLE 3

The procedure was repeated except using a hetero atom such as P, As or Sb, to give a carbonaceous semiconductor film of n-type having good physical properties similar to those of the semiconductor film of Example 2.

What is claimed is:

1. A process for preparing carbonaceous p-type semiconductor material which comprises the steps of:
   heating an aromatic polyimide to carbonize the polyimide; and
   incorporating into the carbonized polyimide one or more hetero atoms other than carbon atom which are selected from the group consisting of B, Al, Ga, and In.

2. The process of claim 1, wherein the carbonized polyimide is purified before it is subjected to the incorporation of one or more hetero atoms.

3. The process of claim 1, wherein the step of heating an aromatic polyimide is performed under the condition that the heated polyimide is kept under pressure to orient carbon molecules in the carbonized polyimide.

4. The process of claim 1, wherein the polyimide to be heated is in the form of a sheet or a film.

5. The process of claim 1, wherein the step of heating an aromatic polyimide to carbonize the polyimide is performed at a temperature of 700 to 1,500° C.

6. The process of claim 1, wherein the step of heating an aromatic polyimide to carbonize the polyimide is performed at a temperature of 700 to 900° C.

7. A process for preparing carbonaceous n-type semiconductor material which comprises the steps of:
   heating an aromatic polyimide to carbonize the polyimide; and
   incorporating into the carbonized polyimide one or more hetero atoms other than carbon atom which are selected from the group consisting of P, As, Sb and Bi.

8. The process of claim 7, wherein the step of heating an aromatic polyimide to carbonize the polyimide is performed at a temperature of 700 to 1,500° C.

9. A process for preparing carbonaceous n-type semiconductor material which comprises heating an aromatic polyimide which contains one or more hetero atoms other than carbon atom which are selected from the group consisting of P, As, Sb and Bi, to carbonize the hetero atom-containing polyimide.

10. The process of claim 9, wherein the heating is performed at a temperature of 700 to 1,500° C.

11. A process for preparing carbonaceous p-type semiconductor material, which comprises heating an aromatic polyimide which contains one or more hetero atoms which are selected from the group consisting of Al, Ga and In, to carbonize the hetero atom-containing polyimide.

12. The process of claim 11, wherein the heating is performed at a temperature of 700 to 1,500° C.

* * * * *